US010226852B2

(12) United States Patent
Turovets

(10) Patent No.: US 10,226,852 B2
(45) Date of Patent: Mar. 12, 2019

(54) SURFACE PLANARIZATION SYSTEM AND METHOD

(71) Applicant: NOVA MEASURING INSTRUMENTS LTD., Rehovot (IL)

(72) Inventor: Igor Turovets, Moshav Givat Yarim (IL)

(73) Assignee: NOVA MEASURING INSTRUMENTS LTD., Rehovot (IL)

( * ) Notice: Subject to any disclaimer, the term of this patent is extended or adjusted under 35 U.S.C. 154(b) by 0 days.

(21) Appl. No.: 15/108,855

(22) PCT Filed: Jul. 31, 2014

(86) PCT No.: PCT/IL2014/051143
§ 371 (c)(1),
(2) Date: Jun. 29, 2016

(87) PCT Pub. No.: WO2015/101989
PCT Pub. Date: Jul. 9, 2015

(65) Prior Publication Data
US 2016/0318148 A1 Nov. 3, 2016
US 2018/0029189 A9 Feb. 1, 2018

Related U.S. Application Data

(60) Provisional application No. 61/922,241, filed on Dec. 31, 2013.

(51) Int. Cl.
B24B 37/20 (2012.01)
H01L 21/321 (2006.01)
(Continued)

(52) U.S. Cl.
CPC ............ B24B 37/20 (2013.01); B24B 37/015 (2013.01); B24B 37/04 (2013.01); H01L 21/268 (2013.01);
(Continued)

(58) Field of Classification Search
None
See application file for complete search history.

(56) References Cited

U.S. PATENT DOCUMENTS 5,196,353 A 3/1993 Sandhu et al.
5,258,824 A 11/1993 Carlson et al.
(Continued)

FOREIGN PATENT DOCUMENTS

JP 088237 1/1996
JP 08306673 11/1996
(Continued)

OTHER PUBLICATIONS

Williams and Muller, "Etch Rates for micromachining processing", Journal of Microelectromechanical Systems, 5(4) 256-269, (Dec. 31, 1996).

Primary Examiner — Sylvia MacArthur
(74) Attorney, Agent, or Firm — Browdy and Neimark, P.L.L.C.

(57) ABSTRACT

A surface planarization system is presented. The system comprises an external energy source for generating a localized energy distribution within a processing region, and a control unit for operating the external energy source to create, by the localized energy distribution, a predetermined temperature pattern within the processing region such that different locations of the processing region are subjected to different temperatures. This provides that when a sample (e.g. semiconductor wafer) during its interaction with an etching material composition is located in the processing region, the temperature pattern at different locations of the sample's surface creates different material removal rates by the etching material composition (different etch rates).

17 Claims, 3 Drawing Sheets

(51) Int. Cl.
*H01L 21/67* (2006.01)
*B24B 37/015* (2012.01)
*B24B 37/04* (2012.01)
*H01L 21/268* (2006.01)
*H01L 21/3105* (2006.01)
*H01L 21/311* (2006.01)
*H01L 21/66* (2006.01)

(52) U.S. Cl.
CPC .. *H01L 21/31055* (2013.01); *H01L 21/31111* (2013.01); *H01L 21/32125* (2013.01); *H01L 21/67219* (2013.01); *H01L 22/12* (2013.01); *H01L 22/26* (2013.01)

(56) References Cited

U.S. PATENT DOCUMENTS

| | | | |
|---|---|---|---|
| 5,376,233 A | 12/1994 | Man | |
| 5,795,493 A | 8/1998 | Bukhman et al. | |
| 6,358,360 B2 | 3/2002 | Takahashi | |
| 6,379,490 B1 | 4/2002 | Bollinger et al. | |
| 6,746,616 B1* | 6/2004 | Fulford | H01L 21/67253 216/59 |
| 6,994,611 B2* | 2/2006 | Svirchevski | B24B 37/042 134/2 |
| 7,204,639 B1 | 4/2007 | Gotkis et al. | |
| 7,510,974 B2* | 3/2009 | Li | B24B 37/0056 156/252 |
| 8,654,562 B2 | 2/2014 | Deng et al. | |
| 2008/0042078 A1 | 2/2008 | England et al. | |
| 2009/0170320 A1* | 7/2009 | Heinrich | B24B 37/015 438/692 |
| 2016/0318148 A1* | 11/2016 | Turovets | B24B 37/015 |

FOREIGN PATENT DOCUMENTS

| | | |
|---|---|---|
| JP | 2000228391 | 8/2000 |
| JP | 2012510161 | 4/2012 |
| WO | 2010/062818 | 6/2010 |

* cited by examiner

SURFACE PLANARIZATION SYSTEM AND METHOD

TECHNOLOGICAL FIELD AND BACKGROUND

The present invention is in the field of material removal techniques, and relates to a system and method for surface planarization.

With the scaling of the dimensions of microelectronic devices, known as "Moors Law", surface planarization processes used in the fabrication of such devices become more and more critical. A highly integrated semiconductor device is a stack of transistors, contacts and growing number of metal layers.

All back end of line (BEOL) metal layers are fabricated using "dual damascene" DD process, that includes chemical/mechanical polishing (CMP) at the final stage. This CMP process not only planarizes the surface of the entire wafer, but also creates the required thickness of metal lines (controlling resistivity of wires). Similar CMP approach is being applied to creation of the contacts, gates (replacement gate process) and is planned to be used for the creation of the replacement fins. All these surface planarization processes applied at various stages of fabrication are "stop-on" the layer type of CMP, where entire process can be described as at least two stages, where at the first stage (bulk removal) planarization is usually performed until the target layer is not reached, and at the second stage overpolishing is applied to the structure resulting from the first stage in order to ensure complete material removal and to achieve the desired thickness of the target layer.

During the CMP process, the exposed surface of a substrate is typically placed against a rotating polishing pad (disk pad or belt pad), which can be either a standard pad (having a durable roughened surface) or a fixed-abrasive pad (having abrasive particles held in a containment media). The substrate is controllably loaded to push it against the polishing pad. A polishing slurry, including at least one chemically reactive agent (and possibly abrasive particles if a standard pad is used), is supplied to the surface of the polishing pad. A CMP process is implemented in several successive steps, including single- or multi-step "bulk" material removal stage, followed by single- or multi-step overpolish and/or buffing material removal stage.

FIGS. 1A and 1B exemplify the commonly used CMP tool arrangement 10 for performing such multiple successive CMP steps. As shown in FIG. 1A, a rotatable multi-head carousel 12 supports four carrier heads 14A, 14B, 14C and 14D each configured for holding the sample (workpiece), and is rotated about its axis to move the carrier heads with the sample between polishing stations Platen 1, Platen 2, Platen 3 and a transfer station 16. The carrier head can receive and hold a sample S, and press it against the polishing pad, and can also move the respective sample toward and away from the platen surface. During polishing, the carrier heads press their respective samples against the corresponding polishing pad, the platens are rotated about their central axis, and the carrier heads are rotated about their respective central axes and translated laterally across the surface of the polishing pad. The CMP tools arrangement may include one or more in-situ or integral metrology systems that operate to determine a change in the thickness of a film/layer on the sample. The in-situ metrology system is positioned such that measurements can be made in real-time and while the film is being polished; each polishing station can include an independent in-situ measurement system. Integrated metrology tool may be located in between the adjacent polishing stations such that the carrier head brings the sample to a sample holder of the integrated metrology tool. As shown, the sample S starts/enters the CMP tolls arrangement for removal of the top layer (target layer), and this is successively done by the "bulk" removal step performed by Platen 1, and two successive overpolish and buffing steps performed by Platens 2 and 3.

Thus, as shown schematically in FIG. 1B, the conventional CMP tool arrangement 10 includes a set of polishing stations with platens 14 including one or more stations for "bulk" removal steps and a few stations 14 for overpolish and/or buffing removal/planarization. Also included in the CMP tool 10 are cleaning and drying modules 18 and a dry metrology system 20.

General Description

Recent CMP technology developments, such as multizone pressure control, pad thickness control, pad conditioning, special slurries and others have improved CMP performance to a certain level, but this level is barely sufficient for the strict requirements of the current manufacturing technology, and is problematic for any change in the technology. Gas clustered ion beam technology (GCIB) was proposed (U.S. Pat. No. 8,654,562) for the fine tuning and/or correcting and/or improving of the CMP tool performance. This technique, although being aimed at improving the Within Wafer (WIW) thickness uniformity of CMP process, reduction or elimination of such detrimental CMP effects as erosion and dishing, and reduction or elimination of the density effects, unavoidably requires very expensive process equipment to "correct" wafer topography after the entire CMP process.

Usually, the best CMP performance is reached when process is used to remove a part of the layer to simply planarize the wafer surface ("stop-in" layer). In this case, optimal process conditions for single layer removal can be achieved with optimal high planarization slurries. More complex situation arises for "stop-on" layers that represent clear majority of the CMP process steps in current manufacturing process. All "stop-on" CMP steps (including but not limiting to Oxide CMP with stop on SiN, and SiN CMP with stop on Oxide, or Oxide CMP with stop on Poly-Si, W CMP with stop on Oxide, etc.) require multi stage processing with bulk removal followed by overpolish and/or buffing. Both stages are problematic, but especially the second stage where combined and controlled removal of multiple materials may be required. This task is difficult to achieve for all structures with different density in the semiconductor device.

There is accordingly a need in the art for a novel approach for material removal technique, which allows for more precise surface planarization which allows complete removal of the layer in "stop-on", eliminating the need for the complicated overpolish step of the current CMP, as well as the above-mentioned proposed techniques for post CMP corrections.

In order to simplify understanding of the present invention, the following should be noted. The step termed "rough" material removal refers to removal of the majority of the bulk material, but not all bulk material. For the "stop-on" layer, "rough" CMP removal will leave on the entire wafer a thin layer of removed material. Typically, the amount of material that is left is in the range of 10-100 Å, and presents a result of the recipe optimization process. The "fine" material removal refers to removal of the last part of the remaining material (current CMP "stop-on" point) and also all steps of overpolish and/or buffing that create the final profile.

As indicated above, the conventional CMP process includes rough material removal stage followed by a sequence of fine material removal stages. The difference in the rough and fine CMP procedures is in the parameters of CMP process, pad and slurry materials. However, during each of the CMP stages, a polish process is applied to the entire surface of the sample with the same polishing parameters for the respective stage.

The inventors have found that after completion of the rough CMP material removal stage, instead of the current fine material removal CMP stages a novel material removal can be implied that greatly simplifies the process and improves the resulting within the wafer variations, local and global flatness.

The novel fine material removal process of the invention can be applied after the rough CMP stage and is based on the knowledge of the remaining thickness of the layer on the sample (wafer), i.e. sample map. This novel fine removal process utilizes selective etching of the remaining thickness which is locally controlled by application of the external energy etched rate at each point of the wafer (i.e. etch map), etch rate being calculated based on the known remaining thickness, so that the remaining layer is accurately removed from all different density sites on the entire wafer at the same time. By this, all fine material removal CMP steps, including overpolish and/or buffing, are eliminated.

The localized selective etching of the invention also solves such CMP problems as scratches, and can make post CMP cleaning process easier.

Novel material removal/surface planarization technique of the invention can be implemented in a stand alone material removal system, or can be integrated with the conventional CMP system used for the "rough" material removal, e.g. may follow the rough CMP stage. So, the present invention may be used for the fine tuning and/or correcting and/or improving of a CMP tool performance, at various possible configurations.

Generally, the novel material removal (or surface planarization) technique of the present invention can be used for removal of any target material from substrates other than semiconductor wafers, such as plastics, glass, etc., and can be used in various applications, for example for manufacturing electronic components, such as LCD screens, MEMS, Systems on Chip (SOC), advanced memory and logic devices, power switches, etc.

The present invention utilizes a localized selective material removal. In this connection, the following should be noted. The term "selective" refers to the selective etch of the target material(s) while other materials remain intact (etch rate of target material is much larger than etch rate of other materials). The term "localized" refers to the differences in the etch rate created by application of the external field such as temperature field, on one or more selected/identified sites (locations) on the sample's surface to control material removal rate. The term "localized" may also refer to the external energy (temperature) sample (wafer) map that allows creation of user defined etch rate map. The term "localized material removal" is essentially different from the "mask" based approach when lithography is used to create the pattern on the sample that is being selectively etched only on the exposed sites. The localized material removal of the present invention utilizes "etch rate controlled" localized material removal on all sites/locations on the sample, i.e. the etch material is applied to the entire sample's surface while on the selected sites/locations the material removal is faster than in other surface locations.

In other words, according to the invention, the material removal from selective sites of the sample's surface by etching utilizes the entire sample's surface interaction with the etching material, but, contrary to the conventional approach, utilizes a pattern/profile of the etching rate within the sample, i.e. the etching rate varies within the surface according to a predetermined pattern. As a result, different locations of the sample's surface undergo different levels of material removal. Knowledge of the thickness of the layers on the sample before the treatment allows for determining the pattern that is required to achieve the target of accurate material removal on the different sites at the entire sample surface. In some embodiments, such etching rate pattern (varying etching rate) is achieved by applying to the sample's surface a corresponding localized energy distribution affecting the etching process, e.g. a temperature pattern. Thus, in some embodiments, the present invention provides for selective removal of a target material on a sample (e.g. semiconductor wafer) with the variable etch rate at each location on the sample defined by the local sample temperature, which results from local heating. Generally, the desired temperature pattern on the sample's surface can be achieved by applying a spatially varying external radiation/field.

It should be understood that the material removal technique of the invention can be applied to a sample through selective wet etch process, but can be also applicable to any other selective removal processes with high external energy dependence, e.g. temperature dependence. Also, as indicated above, the present invention can be used for partial removal of a target material up to the desired target thickness, as well as for complete removal of the target material or materials.

Thus, according to one broad aspect of the invention, there is provided a surface planarization system comprising: an external energy source for generating a localized energy distribution within a processing region, and a control unit for operating said external energy source to create, by said localized energy distribution, a predetermined temperature pattern within said processing region such that different locations of said processing region are subjected to different temperatures, providing that when a sample interacting with an etching material composition is located in said processing region, the temperature pattern at different locations of the sample's surface creates different material removal rates by said etching material composition.

In some embodiments, the external energy source comprises one or more heaters. The heater(s) is/are may be of type generating electromagnetic radiation. In some embodiments, the energy source comprises a matrix of heaters arranged in a plane in a spaced-apart relationship, such that actuation of selective heaters with required working parameters creates the localized energy distribution in the processing region. Such working parameters may include one or more of the following: heating temperature, pulsed or CW operational mode, duration of heating, heating pulse shape, a time pattern of pulses (heating pulse duration and delay between heating pulses).

The control unit comprises an energy controller utility comprising a data processor configured for receiving and processing input data and generating operation data to the energy source. This operation data is indicative of the temperature pattern to be produced by the energy source in the processing region. In some embodiments, the input data comprises a sample map corresponding to thickness profile of a layer on the sample, and the data processor of the control unit is configured for processing the sample map data, determining a corresponding etch map, and generating the corresponding operation data to the energy source. In some other embodiments, the input data comprises etch map data corresponding to a sample map indicative of thickness profile of a layer on the sample to be processed by the system. The control unit may be configured for communication with an external system for receiving said input data. Such external system may be inspection/measurement/metrology system or external storage device which receives data from such inspection/measurement system. Such system is referred hereto at times as inspection system and times as metrology system. It should be understood that for the purposes of the present invention the ability of such system to determine a thickness profile for the sample' layer is required. The metrology system may be configured for optical metrology e.g. using spectrometry, reflectometry, ellipsometry, and any suitable combination of these techniques.

In some embodiments, the surface planarization system also includes an in-situ inspection module which is in data communication with a control unit of the temperature field source. The in-situ inspection module is configured and operable for measuring at least one parameter, being a parameter of the sample and/or of the etch material composition, and generating process control data to be used (by the control unit) for controlling working parameters of the energy source to maintain the required temperature pattern and to define end point of the planarization process, when required result is being achieved.

According to another broad aspect of the invention, there is provided a surface planarization system comprising: an external energy source capable of generating a localized energy distribution within a processing region; a support unit for supporting a sample in an etching solution, in said processing region; and a control unit for receiving input data indicative of a sample map, determining a corresponding etch map, and generating operation data for operating said energy source to create the localized energy distribution creating a predetermined temperature pattern in said sample, thereby causing a temperature dependent etching pattern within the sample.

According to yet another broad aspect of the invention, there is provided a processing system for processing samples progressing on a production line, the system comprising:

a material removal system configured for applying at least one "rough" material removal process to a sample's surface;

the above-described surface planarization system configured for processing said sample after being processed by the "rough" material removal system, an inspection system configured for inspecting the sample and generating process control data enabling generation of operation data to said surface planarization system.

The inspection system may comprises an integrated metrology tool configured for applying measurements (e.g. optical measurements) to the sample before its processing by the surface planarization system, and generating the output data corresponding to a sample map or an etch map. The processing system may include an in-situ metrology module associated with the surface planarization system and configured and operable for measuring one or more parameters, including at least one parameter of the sample and/or at least one parameter of the etch material composition, and generating process control data for controlling working parameters of the energy source to maintain the required temperature pattern.

The material removal system may be configured for material removal by CMP.

According to yet further aspect of the invention, there is provided a chemical mechanical polishing (CMP) tool arrangement comprising: at least one CMP station for applying a rough CMP processing to a sample; and the above-described surface planarization system located downstream of the CMP station(s) and being operable for applying fine surface planarization, by said selective etch, to the sample.

According to yet another aspect of the invention, there is provided a method of processing samples (e.g. semiconductor wafers) progressing on a production line, method comprising:

applying a rough CMP processing to the sample, in at least one CMP step;

applying optical metrology measurements to the sample after said rough CMP processing and generating process control data indicative of a thickness profile for a target layer on the sample;

applying fine surface planarization to the measured sample, said fine surface planarization comprising: interacting the sample with an etching material composition, and applying energy to the sample during said interaction with the etching material composition thereby creating a temperature pattern in the sample determined in accordance with said measured thickness profile, said temperature pattern creating a corresponding etch map at the surface of the sample, such that different locations of the sample's surface are subjected to different material removal rates by said etching material composition.

More specifically, the present invention is useful in semiconductor industry for surface planarization of wafers, which is typically done by CMP, and is therefore exemplified below with respect to this specific application. It should, however, be understood, and explained above, that the principles of the invention are not and should not be limited to this specific application.

BRIEF DESCRIPTION OF THE DRAWINGS

In order to better understand the subject matter that is disclosed herein and to exemplify how it may be carried out in practice, embodiments will now be described, by way of non-limiting example only, with reference to the accompanying drawings, in which:

FIG. 3A shows the sample's structure which is to undergo the partial material removal by selective etching and the main constructional parts of the material removal system applied to the sample; and FIGS. 3B to 3D show the sample in its three successive states, before selective etching, under selective etching, and after the selective etching.

DETAILED DESCRIPTION OF EMBODIMENTS

Figure 1A:
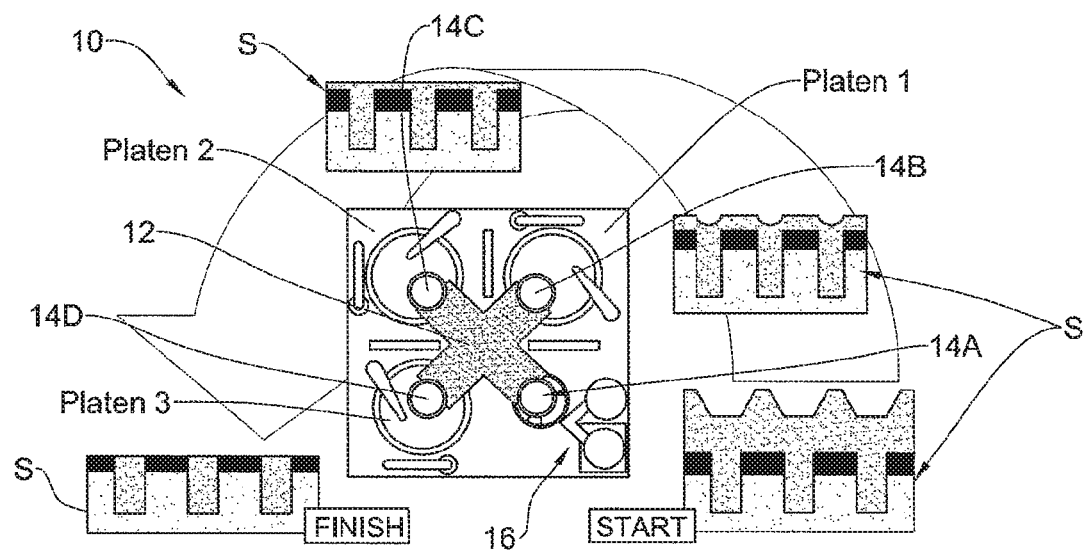
FIGS. 1A and 1B schematically illustrate configuration and operation of a CMP tools arrangement used in semiconductor industry.
Figure 1B:
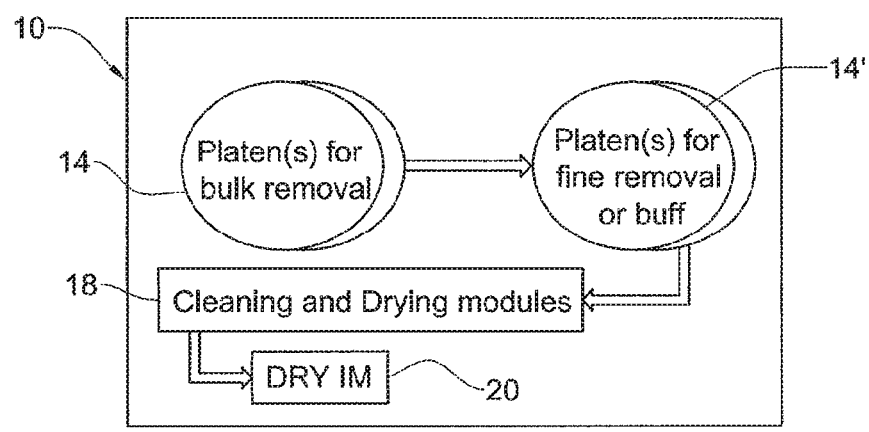

As described above with reference to FIGS. 1A and 1B, the material removal process, conventionally applied to semiconductor wafers progressing on a production line, includes CMP rough removal followed by several CMP fine stages, where each CMP stage consists of polishing the entire surface of the wafer.

Figure 2:
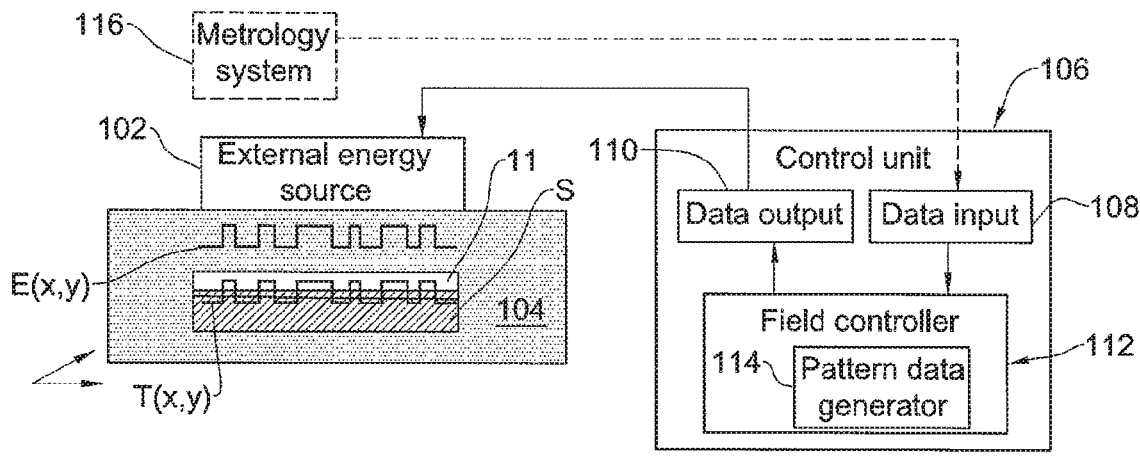
FIG. 2 is a schematic illustration of a surface planarization system of the present invention.

Reference is now made to FIG. 2 schematically illustrating a material removal/surface planarization system, generally at 100, of the present invention, applied to a sample S interacting with (coated by/embedded in) etching material composition 11. The system 100 includes an external energy source 102 and is associated with a control unit 106. As will be described further below, the control unit 106 may be part of the system 100 or an inspection/measurement station, or a part of a stand alone system interconnected (e.g. via wireless data communication) between the surface planarization system 100 and the inspection station, or the software utilities of the control unit may be distributed between any two or more of such systems/stations.

The energy source 102 is configured and operable for generating a localized energy/temperature distribution E(x, y) within a processing region 104 and is operable by the control unit 106 to create a predetermined temperature pattern within the processing region, such that different locations of the processing region 104 are subjected to different temperatures. Hence, when an interaction interface between the sample S and etcher 11 is located in the processing region 104 it is affected by a corresponding temperature pattern T(x,y) such that different temperatures at different locations of the sample's surface creates different material removal rates by the etching material composition.

The external energy source may be of any known suitable type, e.g. electric, optical (lamps, lasers, etc.), magnetic, e.g. using pulsed or CW radiation. In a non-limiting example, the energy source 102 may include a matrix of spaced-apart heaters arranged to be aligned with a corresponding matrix of locations within the sample's surface, such that actuation of the selective heaters with required working parameters (heating temperature, operational mode (e.g. pulses), duration of heating, pulse shape, time pattern of pulses) creates a heat distribution pattern across the sample.

The control unit 106 is configured for generating operating data to the energy source 102 to create the localized temperature distribution E(x,y), i.e. spatial variation of the temperature field within the processing region, such that a corresponding temperature pattern/profile T(x,y) is created at the sample's surface S (interaction interface with etcher) while located in the processing region 104. When the sample with such temperature profile therealong interacts with a suitable etching material composition, a corresponding profile of the material removal parameter(s) (e.g. variable etch rate at different locations on the sample), defined by the local sample's temperature, is created along the interaction interface, and accordingly different locations of the sample in the interaction region are differently affected by the temperature field causing different levels of material removal at different sample's locations, e.g. material removal at selected locations on the sample. Examples of the energy sources 102 that create temperature field pattern can be lamps, lasers, and other sources CW or pulsed sources.

The control unit 106 is typically an electronic/computer system including inter alia such utilities (hardware and/or software) as data input and output utilities 108 and 110, and an energy controller utility 112. The energy controller utility 112 is a data processor including a pattern data generator module 114, which processes input data indicative of sample's locations (coordinates) from which material is to be removed (a so-called "wafer map" or "etch map") and generates data indicative of a corresponding energy distribution pattern E(x,y) to be produced by the energy source in the processing region where the sample's surface is located.

It should be understood that in some embodiments the input data indicative of sample's locations from which material is to be removed may be input to the control unit while being for example in the form of a measured layer thickness profile on the sample (a so-called "wafer map"). The wafer map data may be received. directly from an inspection system (on-line operational mode) or from a storage device (off-line mode). The data processor of the control unit may be preprogrammed for processing the sample map data, determining a corresponding etch map, and generating the operation data to the energy source to produce the corresponding temperature pattern. In some other embodiments, the input data includes input data etch map data (determined for example by a controller of the inspection system) which corresponds to a sample map indicative of thickness profile of a layer on the sample to be processed. In this case, the control unit analyses the etch map and generates operation data to the energy source indicative of the corresponding temperature pattern to be created. Generally speaking, the data processing algorithms for determining the sample map and corresponding etch map, transforming it into a matching temperature pattern may be implemented by software modules distributed between the control utilities of the control unit of the planarization system 100 and a control unit of an external inspection system (integrated or stand alone).

As further shown in FIG. 2 in dashed lines, the surface planarization system 100 of the invention may be associated with an in-situ metrology module/system 116 for the process control. Such system 116 applies measurements (e.g. optical) to the sample during the selective etch process performed by system 100 (i.e. by the energy source operation) and supply the updated input data (e.g. sample map or etch map, as the case may be) to the control unit for controlling the working parameters of the energy source and thus controlling the selective removal process. The metrology module 116 is configured for single- or multi-site/point measurements of the target parameters during the selective etch process. Such measured parameters include, but not limited to, a thickness of the layer that is being partially of fully removed from the sample. It should also be noted that such metrology module 116 for real time in-situ material removal (selective wet etch) can monitor composition/concentration of the etch solution instead or in addition to the sample's parameters measurements.

As indicated above, the selective material removal technique of the present invention (i.e. different levels of material removal at different locations on the sample's surface) can be used with any material removal process which has temperature dependence. In some embodiments, such different levels of material removal at different locations on the sample's surface may be constituted by variable etch rate of a material on the sample defined by the varying local sample temperatures. This may for example be achieved through selective wet etch process. Also, as mentioned above, removal of the target material to be achieved by the present invention refers to partial removal of the material up to the target thickness, as well as complete removal of the target material(s).

It should also be understood that the etching mode itself (temperature/duration, etching material compositions) may utilize any suitable technique, which are generally known in the art of etching processes commonly used in lithography, e.g. as used in semiconductor industry. Examples of selective etch agents and temperature dependence of selective etch micromachining processes are known in the art, e.g. described in the article K. R Williams and R. S Muller, "*Etch*

*Rates for micromachining processing*", Journal of Microelectromechanical Systems, Vol, No4, p 256-269, December 1996.

Figure 3A:
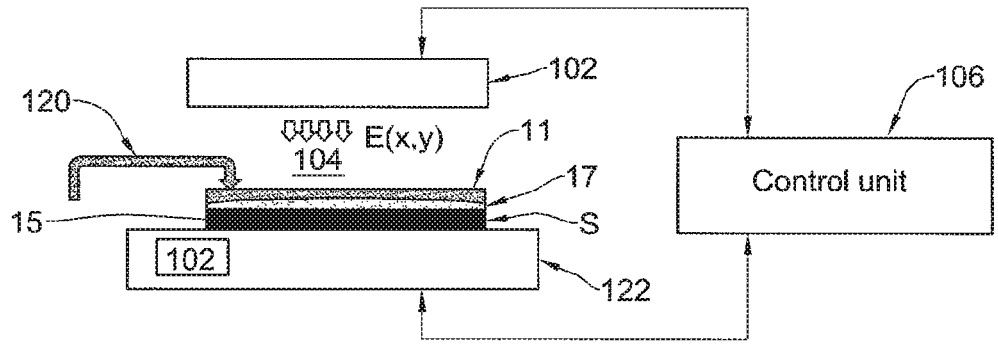
FIGS. 3A to 3D exemplify the present invention being used for selective etching of a sample, where

Reference is made to FIGS. 3A to 3D which exemplify how the present invention is used for selective etching of a sample. FIG. 3A exemplifies the sample's structure S which is to undergo the partial material removal by selective wet etch process of a target material, and the surface planarization system 100 applied to the sample. As shown, the sample's structure S includes a substrate (single- or multilayer) 15 and a top layer 17 of target material, which is to be partially removed from selective locations, e.g. layer 17 is to be patterned, which patterning may be aimed at final surface planarization. To this end, an etching solution 11 is applied to the sample, e.g. is deposited onto top layer 17, via an etch reagents delivery system (nozzle), generally at 120.

The construction and operation of such material delivery systems are known per se and do not form part of the invention, and therefore need not be specifically described, except to note that any material delivery system can be used, including material delivery system with a rotation mechanism for creating a paddle. The system 100 includes an external heating source 102 (constituting energy source) capable of creating localized energy distribution E(x,y) in a processing region 104, where the sample interacting with etching material is located, and operable by a control unit 106 such that the localized energy field distribution creates desired temperature profile T(x,y) within the sample-etch interface. As illustrated in the figure, the heating source 102 may include a heating unit accommodated at the sample's surface side being spaced and configured for directing heating radiation towards the sample's surface, and/or may include a heating unit accommodated inside a sample's holding chuck 122. The heating unit(s) is/are operable by data from the pattern data generator of the control unit to allow localized heating of any part of the sample's surface. As indicated above, the localized heating can be done by any pulsed or CW sources. The system 100 may be associated with a metrology module (inspection system) for real time in-situ control of the material removal process.

Figures 3B, 3C, 3D:
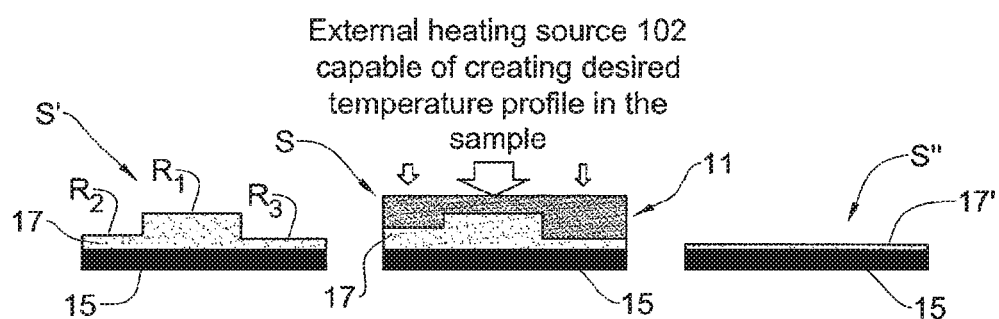

FIGS. 3B to 3D exemplify the operation of the system 100. Three successive states of the sample are shown, before the selective etching by system 100, under the selective etching, and after the selective etching. As shown in FIG. 3B, sample S' progressing on the production line, e.g. resulting from a preceding rough CMP stage, includes a substrate 15 and a target material 17 on the substrate. The target material 17 has a pattern, i.e. a surface relief, exemplified here as three regions $R_1$, $R_2$ and $R_3$ of in different thicknesses. This sample undergoes surface planarization processing of the technique of the invention (FIG. 3C): etching material/layer 11 is added above the target layer 17, and the entire structure is subjected to a temperature pattern created by external energy source 102. As described above, the energy source 102 is operated by the control unit 106, which utilizes input data (etching material used, required final thickness profile, as well as parameters of the heating source, and determines the working parameters of the surface planarization system (e.g. heating temperature map/pattern (providing desired etch map), optimal usage of pulsed or CW operational mode, duration of heating, heating pulse shape, time pattern of heating pulses) to ensure creation of desired heat (temperature) distribution within the interface and duration of the heat application to achieve the desired etch rate pattern/profile. As shown in FIG. 3C, such selected energy distribution results in the desired pattern of material removal, i.e. the sample S" has a desired thickness pattern of the target material layer 17', achieved in a single-stage process.

As indicated above, the technique of the present invention may be used for the fine tuning and/or correcting and/or improving of a CMP tool performance, at various possible configurations. For example, the surface planarization system 100 of the invention can be integrated or used as part of an existing CMP process equipment as an additional module located in the CMP sequence after the platen or platens, or instead of one of the platens, or instead of the last or buffing platen. This is shown schematically in FIG. 4. Here, the surface planarization system 100 is used as a part of the CMP tool arrangement 200, and is installed downstream of the metrology/inspection station 18 (integrated metrology tool), which receives and inspects a sample after being processed by the rough CMP stage 12. In this example, the control unit receives input data from the inspection system 220 and delivers output data for operation of the surface planarization system 100. Also, as indicated above, the surface planarization system of the invention can be used as a Stand-Alone (SA) tool, as a so-called "verification station", for correction after the standard CMP process (e.g. conventional multi-stage material removal process of FIGS. 1A and 1B) was completed.

It should be noted that the integrated technique for the fine tuning and/or correcting and/or improving of the CMP tool performance allows better productivity, cost effectiveness and better throughput of CMP tool arrangement, by elimination or at least significant reduction of the rework, over polish step or steps, reduction of number of platens and reduction of selectivity requirements of different CMP slurries. Also, such fine tuning and/or correcting and/or improving of the CMP process allows better overall performance, including improvement of Within Wafer (WIW) thickness uniformity of CMP process, reduction or elimination of such detrimental CMP effects as erosion and dishing, reduction or elimination of the density effects, as well as reduction of CMP induced defects, such as scratches, and simplify the cleaning processes required after CMP. It should also be noted that all stop-on CMP steps (including but not limited to Oxide CMP with stop on SiN, and SiN CMP with stop on Oxide, or Oxide CMP with stop on Poly-Si, W CMP with stop on Oxide, etc.) that currently require multi-platen processing with problematic over polish step and/or buffing, can be reduced with addition of the technique of the invention to a more simple single-platen stop-in layer bulk material removal methods and tools.

The invention is applicable for selective removal or etching of oxide, SiN, Si, metals, etc. using known selective etch agents and known temperature dependence. The invention can be used to correct CMP performance for both dielectric and metal CMP processes, including but not limited to STI CMP, replacement gate CMP, W CMP, Cu CMP, etc. It should further be noted that the technique of the invention, exemplified above as being used with CMP process, can also be used for other semiconductor manufacturing processes, such as patterning process, or material deposition process, e.g. Chemical Vapor Deposition (CVD), for controlling/verifying/correcting the final material thickness profile.

The following is an example of the advanced process control scheme suitable when using the surface planarization system 100 of the invention as an integrated part of the existing CMP process equipment, e.g. as illustrated in and described above with reference to FIG. 4. According to this process control scheme, the Wet Area Integrated metrology (IM) tool/station 220 is located downstream of the platen or platens 14 of the CMP (e.g. rough CMP) and upstream of the system 100. The wafer is kept dry or wet while being examined by IM tool 220. This wet area IM system 220 is configured for measuring/determining the wafer map of the target parameters after the rough CMP by platen 14 and defining the required material removal needs, i.e. the final thickness pattern or the pattern of the thickness change, as the case may be. This wafer map (e.g. data indicative of sample's locations from which material is to be removed) is used as Feed Forward advanced process control for the proposed integrated selective etch removal system 100 (i.e. determination of the corresponding etch map), and the same wafer map is used as Feed Back advanced process control to the CMP platen 12. In addition, as an option, additional metrology tool 20 (integrated or stand alone) can be used after completion of the entire material removal and surface planarization processes, i.e. downstream of system 100, serving mean of overall process quality control.

In case the surface planarization system 100 is used in a separate stand alone station/tool configuration for correction after standard CMP process is completed, a stand-alone metrology system can be used to pre-define the wafer map of the required removal/planarization needs (i.e. required thickness profile), prior to application of the selective wet etch process (Feed-Forward advanced process control), and to assess the overall performance after the selective wet etch process (Feed-Back advanced process control).

Figure 4:
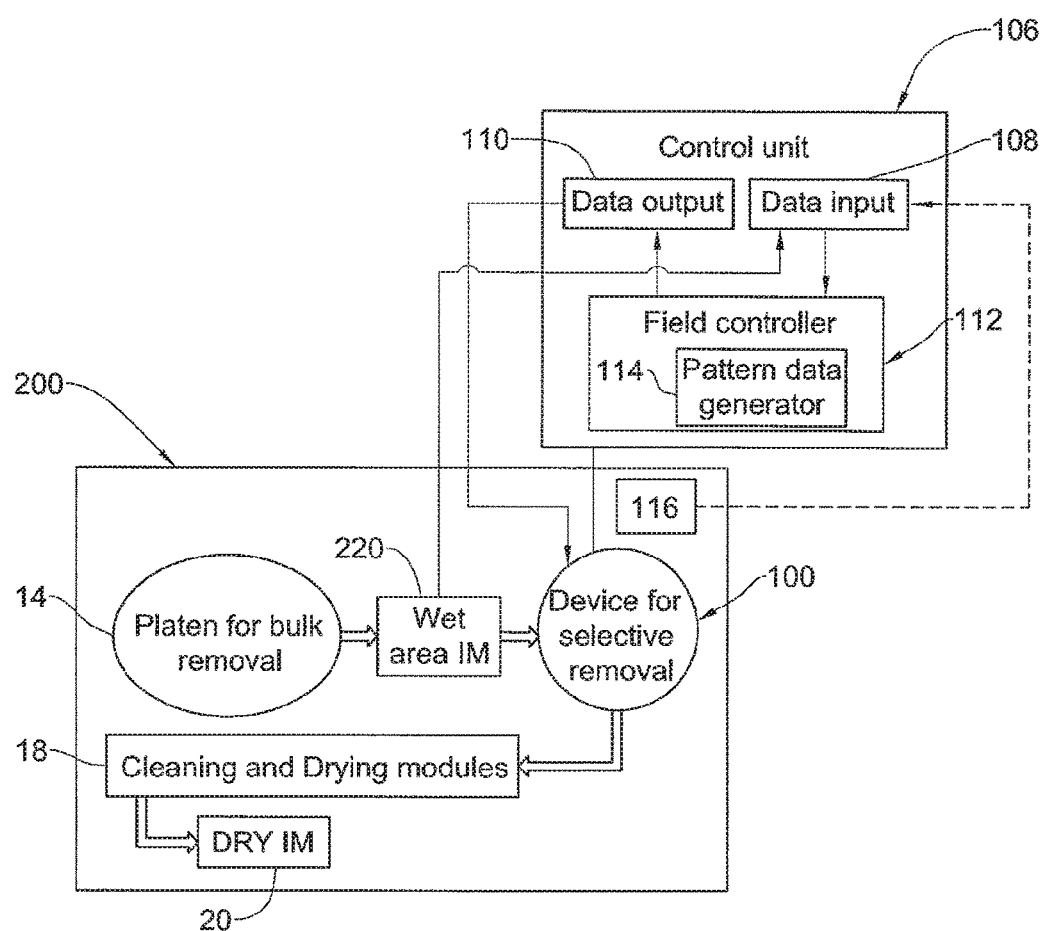
FIG. 4 schematically illustrates a modified CMP tool arrangement utilizing the surface planarization system of the present invention replacing the conventional fine CMP stages.

As described above with reference to FIG. 2, and also exemplified in FIG. 4, in-process control can be optionally used to control the selective removal process. In this case additional in-situ metrology module 116 can be used for input to the control module 100. This metrology module 116 allows measurement (single or multiple points/areas) of the target parameters during the etch process including, but not limited to, thickness of layer that is being partially of fully removed. As described above, the metrology module 116 for real time in-situ material removal (selective wet etch) can monitor composition/concentration of the etch solution instead or in addition to the sample measurements.

For example, the STI CMP process using the present invention, can be done as follows: A wafer is made planar with high efficiency oxide slurry, such that a thin uniform layer of Oxide remains on the wafer being polished and a thin Oxide layer still remains. The thickness of the remaining oxide layer across the wafer is measured to define the required temperature distribution and heat duration pattern for the removal process. Selective removal (etch) according to the invention is performed to entirely remove the remaining oxide layer, and SiN is exposed uniformly across the wafer without dishing/erosion, excessive over polish, etc. To this end, the STI CMP tool can for example be modified as follows: one of the polishing platen is used for planarization with high planarization efficiency oxide slurry; the IM (dry/wet) wet area metrology module 220 is located downstream of the polishing stage to measure the residue wafer map, and the surface planarization system 100 of the invention is then applied for selective removal of the residue layer. Then, after the wafer is cleaned and dried it is measured by Dry metrology tool 20 (integrated or stand alone) for overall quality of the process.

The invention claimed is:

1. A processing system for processing samples progressing on a production line, the processing system comprising:
   a rough material removal system configured and operable to remove a majority of a bulk material from a surface of a sample resulting in a remaining layer material distribution along said surface;
   a surface planarization system configured and operable to perform a fine material removal of said remaining layer material from said sample's surface after being processed by said rough material removal system by applying a selective wet etching process to said surface, said surface planarization system comprising: a support unit for supporting the sample such that the entire surface of the sample interacts with an etching solution; an external energy source configured and operable to create localized energy distribution within the sample's surface; and a control unit programmed and operable to determine etch map data in accordance with map data of the sample's surface, and generate operation data for controlling working parameters of said energy source to create the localized energy distribution creating and maintaining a predetermined temperature pattern within said surface of the sample, thereby causing a temperature dependent etching pattern within the sample's surface to be performed until an end point of the planarization process; and
   a metrology system configured and operable to carry out the following: perform measurements on the sample including measurements applied to the sample after being processed by said rough material removal system or during said selective wet etching, or both; obtain measured data; determine therefrom the sample's surface map data, and provide process control data indicative of said sample's surface map data to the control unit, enabling the determination of the etch map data and generation of the operation data to said energy source of the surface planarization system.

2. The processing system of claim 1, wherein said metrology system comprises an in-situ metrology module associated with the surface planarization system.

3. The processing system of claim 2, where said in-situ metrology module is configured and operable for: measuring at least one parameter, said at least parameter including at least one sample parameter and/or at least etch material composition parameter, and generating the process control data for controlling the working parameters of the energy source to maintain the temperature pattern.

4. The processing system of claim 3, wherein said material removal system is configured for material removal by chemical mechanical polishing (CMP).

5. The processing system of claim 2, wherein said material removal system is configured for material removal by chemical mechanical polishing (CMP).

6. The processing system of claim 1, wherein said rough material removal system is configured for material removal by chemical mechanical polishing (CMP).

7. The processing system of claim 1, comprising a chemical mechanical polishing (CMP) tool arrangement comprising said rough material removal system comprising at least one CMP station for applying the rough CMP processing to the sample's surface, and said surface planarization system located downstream of said at least one CMP station and being operable for applying said fine material removal to said sample's surface by said selective wet etching process.

8. A method of processing samples progressing on a production line, the method comprising:
   providing the processing system of claim 1;
   operating the rough material removal system of the processing system for applying a rough CMP processing to the sample, in at least one CMP step, and removing a majority of a bulk material from a surface of the sample resulting in a remaining layer material distribution along said surface;

operating the metrology system of the processing system for applying optical metrology measurements to the sample after said rough CMP processing and generating process control data indicative of a thickness profile for a target layer on the sample;

operating the surface planarization system of the processing system for applying fine surface planarization to the measured sample, said fine surface planarization comprising: interacting the sample with an etching material composition, and applying energy to the sample during said interaction with the etching material composition thereby creating a temperature pattern in the sample determined in accordance with said measured thickness profile, said temperature pattern creating a corresponding etch map at the surface of the sample, such that different locations of the sample's surface are subjected to different material removal rates by said etching material composition.

9. The processing system according to claim 1, wherein the external energy source is configured and operable by the control unit for generating the predetermined temperature pattern within said processing region, such that different locations of said processing region are subjected to different temperatures, providing that when the sample's surface interacting with an etching material composition is located in said processing region, the temperature pattern at different locations of the sample's surface creates different material removal rates by said etching material composition.

10. The system according to claim 9, wherein said external energy source comprises one or more heaters.

11. The system according to claim 10, wherein said one or more heaters are configured for generating electromagnetic radiation.

12. The system according to claim 10 wherein said external energy source comprises a matrix of heaters arranged in a plane in a spaced-apart relationship, such that actuation of selective heaters with the required working parameters creates said localized temperature distribution in the processing region.

13. The system according to claim 12, wherein the working parameters include at least one of the following: heating temperature, pulsed or CW operational mode, duration of heating, heating pulse shape, time pattern of heating pulses.

14. The system according to claim 1, wherein the control unit comprises a process controller utility comprising a data processor programmed to receive and process input data and generate the operation data to the energy source, said operation data being indicative of the temperature pattern to be produced by the energy source within the sample's surface.

15. The system according to claim 14, wherein said input data comprises the sample map corresponding to a thickness profile of a layer on the sample, said data processor of the control unit being programmed to process said sample map data, determine the corresponding etch map, and generate said corresponding operation data to the energy source.

16. The system according to claim 14, wherein said input data comprises the etch map data corresponding to the sample map indicative of a thickness profile of a layer on the sample to be processed by the system.

17. The system according to claim 14, wherein the control unit is programmed to communicate with an external system for receiving said input data.

* * * * *

UNITED STATES PATENT AND TRADEMARK OFFICE
CERTIFICATE OF CORRECTION

PATENT NO.        : 10,226,852 B2
APPLICATION NO.   : 15/108855
DATED             : March 12, 2019
INVENTOR(S)       : Igor Turovets Page 1 of 1

It is certified that error appears in the above-identified patent and that said Letters Patent is hereby corrected as shown below:

On the Title Page

At item (22), delete "PCT Filed: July 31, 2014" and insert --PCT Filed: December 31, 2014--.

Signed and Sealed this
Thirtieth Day of July, 2019

Andrei Iancu
*Director of the United States Patent and Trademark Office*